United States Patent
Liu et al.

(10) Patent No.: US 10,381,449 B2
(45) Date of Patent: Aug. 13, 2019

(54) METHOD OF MANUFACTURING MEMORY DEVICE

(71) Applicant: Winbond Electronics Corp., Taichung (TW)

(72) Inventors: Chung-Hsien Liu, Taichung (TW); Chun-Hsu Chen, Taichung (TW); Lu-Ping Chiang, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 15/867,736

(22) Filed: Jan. 11, 2018

(65) Prior Publication Data

US 2018/0350608 A1 Dec. 6, 2018

(30) Foreign Application Priority Data

May 31, 2017 (CN) .......................... 2017 1 0396986

(51) Int. Cl.
  *H01L 29/423* (2006.01)
  *H01L 21/28* (2006.01)
  (Continued)

(52) U.S. Cl.
  CPC .... *H01L 29/42324* (2013.01); *H01L 21/0214* (2013.01); *H01L 21/0217* (2013.01); *H01L 21/02359* (2013.01); *H01L 21/28273* (2013.01); *H01L 21/31111* (2013.01); *H01L 27/11521* (2013.01); *H01L 29/4916* (2013.01);
  (Continued)

(58) Field of Classification Search
  CPC ......... H01L 29/42324; H01L 21/76224; H01L 21/02252; H01L 21/02247
  See application file for complete search history.

(56) References Cited

U.S. PATENT DOCUMENTS 7,611,964 B2 * 11/2009 Cho .................. H01L 27/11521
  257/E21.002
7,972,933 B2 * 7/2011 Olsen ................ H01L 21/02247
  257/E21.079
(Continued)

FOREIGN PATENT DOCUMENTS

KR      100972671      7/2010
TW      201036108      10/2010

OTHER PUBLICATIONS

"Office Action of Taiwan Counterpart Application," dated Feb. 12, 2018, p. 1-p. 6.

*Primary Examiner* — Bac H Au
(74) *Attorney, Agent, or Firm* — JCIPRNET

(57) ABSTRACT

A method of manufacturing a memory device including following steps is provided. A first dielectric layer and a first conductive layer are formed in order on the substrate. A first opening and a second opening on the first opening are formed in the substrate, the first dielectric layer and the first conductive layer. An isolation structure is formed in the first opening. A second dielectric layer is formed on the substrate to conformally cover a top surface of the first conductive layer and a surface of the second opening. A heat treatment is performed on the second dielectric layer to enhance the bonding between the second dielectric layer and the first conductive layer. An etching process is performed, so as to remove a portion of the second dielectric layer and expose a top surface of the isolation structure.

10 Claims, 3 Drawing Sheets

(51) Int. Cl.
  *H01L 21/02* (2006.01)
  *H01L 29/51* (2006.01)
  *H01L 21/311* (2006.01)
  *H01L 29/49* (2006.01)
  *H01L 27/11521* (2017.01)
  *H01L 21/762* (2006.01)

(52) U.S. Cl.
  CPC ...... *H01L 29/518* (2013.01); *H01L 21/02247* (2013.01); *H01L 21/02252* (2013.01); *H01L 21/02271* (2013.01); *H01L 21/02345* (2013.01); *H01L 21/76224* (2013.01)

(56) References Cited

U.S. PATENT DOCUMENTS

| | | | |
|---|---|---|---|
| 8,148,267 B2* | 4/2012 | Cho | H01L 27/11521 216/57 |
| 9,236,497 B2* | 1/2016 | Liao | H01L 27/11521 |
| 9,406,784 B1* | 8/2016 | Chuang | H01L 29/66825 |
| 2009/0098740 A1* | 4/2009 | Kim | H01L 21/76232 438/782 |
| 2009/0108323 A1* | 4/2009 | Jee | H01L 21/76224 257/315 |
| 2009/0283818 A1* | 11/2009 | Cho | H01L 21/28273 257/321 |
| 2011/0217834 A1 | 9/2011 | Ganguly et al. | |
| 2015/0263118 A1* | 9/2015 | Kamigaichi | H01L 29/42324 257/321 |

* cited by examiner

METHOD OF MANUFACTURING MEMORY DEVICE

CROSS-REFERENCE TO RELATED APPLICATION

This application claims the priority benefit of China application serial no. 201710396986.2, filed on May 31, 2017. The entirety of the above-mentioned patent application is hereby incorporated by reference herein and made a part of this specification.

BACKGROUND OF THE INVENTION

Field of the Invention

The invention relates to a method of manufacturing a semiconductor device, and particularly relates to a method of manufacturing a memory device.

Description of Related Art

For the past few years, flash memory has become the main stream of nonvolatile memory device with the advantages of high density, low cost, being rewritable and electrically-erasable. Also, flash memory is commonly applied in various portable electronic products such as notebook computers, MP3, digital cameras, cellphones and game consoles.

With shrinkage of memory manufacturing process, general manufacturing process of flash memory have the following problems. Since the sidewall of a floating gate is so rough that a void or a seam is formed in a control gate when an inter-gate dielectric layer and a control gate are filled into a space between the floating gates, the void or the seam inevitably reduces the reliability and yield of a device. Therefore, it will be an important issue as to how to provide a method of manufacturing a flash memory that makes the sidewall of the floating gate to be flat so as to reduce generation of void or seam in the control gate, thereby improving the reliability and yield of device.

SUMMARY OF THE INVENTION

The invention provides a method of manufacturing a memory device, which may protect a sidewall of a floating gate to avoid the sidewall of the floating gate from being damaged, thereby improving the reliability and yield of a device.

The invention provides a method of manufacturing a memory device; the method comprises the following steps. A first dielectric layer and a first conductive layer are formed in order on a substrate. A first opening and a second opening on the first opening are formed in the substrate, the first dielectric layer and the first conductive layer. An isolation structure is formed in the first opening, wherein a top surface of the isolation structure is lower than a top surface of the first conductive layer. A second dielectric layer is formed on the substrate to conformally cover a top surface of the first conductive layer and a surface of the second opening. A heat treatment is performed on the second dielectric layer to enhance bonding between the second dielectric layer and the first conductive layer. An etching process is performed to remove a portion of the second dielectric layer so as to expose the top surface of the isolation structure. A third dielectric layer is formed on the substrate so that the third dielectric layer covers the remaining portion of the second dielectric layer and the top surface of the isolation structure.

Based on the above, the invention may enhance the Si—N bonding between the second dielectric layer and the first conductive layer (e.g. floating gate) via a rapid thermal annealing process. After the etching process is performed, there is still remaining second dielectric layer disposed on the sidewall of the floating gate to protect the floating gate from being damaged. Therefore, the floating gate can have a smooth surface to reduce generation of the void or the seam in the second conductive layer (e.g. control gate), thereby improving the reliability and yield of device.

In order to make the aforementioned features and advantages of the invention more comprehensible, embodiments accompanying FIGURES are described in detail below.

DESCRIPTION OF EMBODIMENTS

Figure 1A:
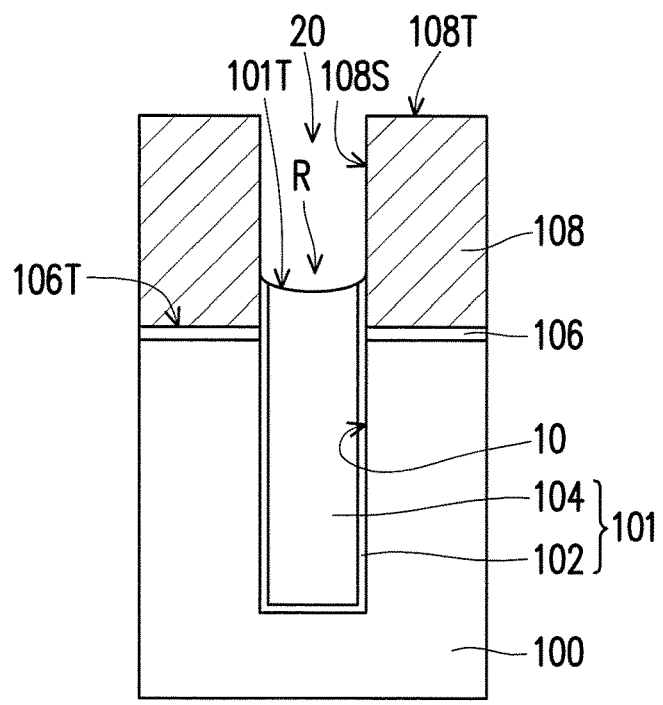
FIGS. 1A to 1E are sectional views of a manufacturing process of a memory device according to one embodiment of the invention.

The invention described in several embodiments is elaborated with reference to the accompanying drawings. Note that the invention may be embodied in various ways and should not be limited to the embodiments provided herein. The thicknesses of layers and regions provided in the drawings are enlarged for illustrative purposes. The same or similar reference numbers represent the same or similar components and thus will not be described in each and every paragraphs below.

In addition, the memory device described in the following paragraphs is exemplified as a flash memory, which should not be construed as a limitation to the invention. In other embodiments, the memory device may be a flash memory array.

Referring to FIG. 1A, the embodiment provides a method of manufacturing a memory device; the method comprises the following steps. First of all, a substrate 100 is provided. In the embodiment, the substrate 100 may be, for example, a semiconductor substrate, a semiconductor compound substrate or a semiconductor substrate over insulator (SOI).

Thereafter, a first dielectric layer 106 and a first conductive layer 108 are formed in order on the substrate 100. In the embodiment, the first dielectric layer 106 may be a tunneling dielectric layer; the first conductive layer 108 may be a floating gate. The material of the first dielectric layer 106 comprises silicon oxide; the material of the first conductive layer 108 comprises polysilicon. In one embodiment, the thickness of the first dielectric layer 106 may be from 50 Å to 80 Å, and the forming method thereof may be a chemical vapor deposition process. The thickness of the first conductive layer 108 may be from 70 nm to 100 nm, and the forming method thereof may be a chemical vapor deposition process.

Subsequently, a first opening 10 and a second opening 20 on the first opening 10 are formed in the substrate 100, the first dielectric layer 106 and the first conductive layer 108. The first opening 10 and the second opening 20 may be formed via a method of, for example, forming a mask pattern (not shown) on the first conductive layer 108. The mask pattern exposes a portion of the surface of the first conductive layer 108 to define the positions of the first opening 10 and the second opening 20. The mask pattern is used as a mask to remove a portion of the substrate 100, a portion of the first dielectric layer 106 and a portion of the first conductive layer 108 to form the first opening 10 and the second opening 20.

Next, an isolation structure 101 is formed in the first opening 10. Specifically, the isolation structure 101 may comprise a first isolation material 102 and a second isolation material 104. The first isolation material 102 is formed conformally in the first opening 10 to cover a sidewall and a bottom surface of the first opening 10. The second isolation material 104 is formed on an inner surface of the first isolation material 102 and fully fills up the first opening 10. As shown in FIG. 1A, the first isolation material 102 covers the second isolation material 104 so that the first isolation material 102 is disposed between the substrate 100 and the second isolation material 104. In one embodiment, the first isolation material 102 may be a high temperature oxide (HTO); the second isolation material 104 may be a spin-on glass (SOG).

It should be pointed out that, as shown in FIG. 1A, a top surface 101T of the isolation structure 101 is lower than a top surface 108T of the first conductive layer 108, which enables a portion of a sidewall 108S the first conductive layer 108 to be exposed. That is to say, the second opening 20 exposes a portion of the sidewall 108S of the first conductive layer 108, which can increase a contact area between the first conductive layer 108 and a second conductive layer 116 (as shown in FIG. 1E) formed subsequently, thereby improving gate-coupling ratio (GCR). In one embodiment, the top surface 101T of the isolation structure 101 may be higher than a top surface 106T of the first dielectric layer 106. In one embodiment, the top surface 101T of the isolation structure 101 is a surface with a recess R, which should not be constructed as a limitation to the invention. In other embodiments, the top surface 101T of the isolation structure 101 may be a flat surface.

Figure 1B:
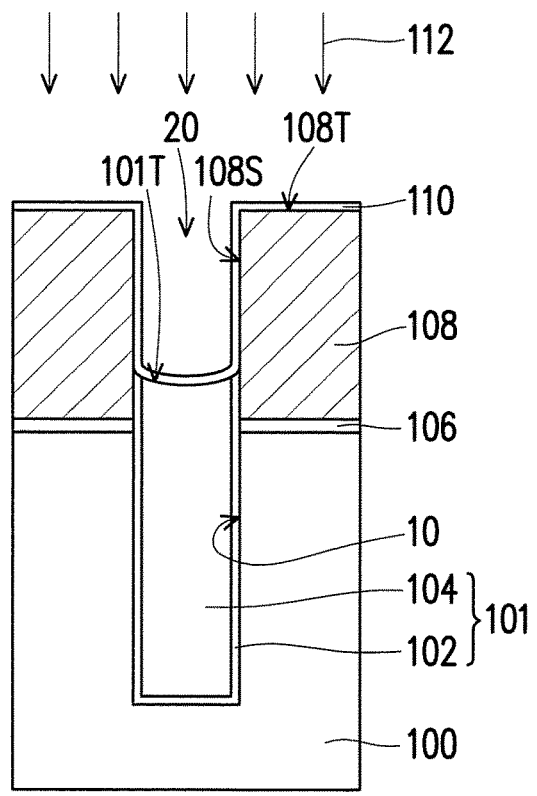

Referring to FIGS. 1A and 1B, a second dielectric layer 110 is formed on the substrate 100. The second dielectric layer 110 conformally covers the top surface 108T of the first conductive layer 108, a portion of the sidewall 108S of the first conductive layer 108 and the top surface 101T of the isolation structure 101 (i.e. the surface of the second opening 20). In one embodiment, the material of the second dielectric layer 110 comprises silicon nitride, silicon oxynitride or a combination thereof. The thickness of the second dielectric layer 110 may be from 1 nm to 2 nm, and the forming method thereof may be a plasma nitridation process or a chemical vapor deposition process.

Figure 1C:
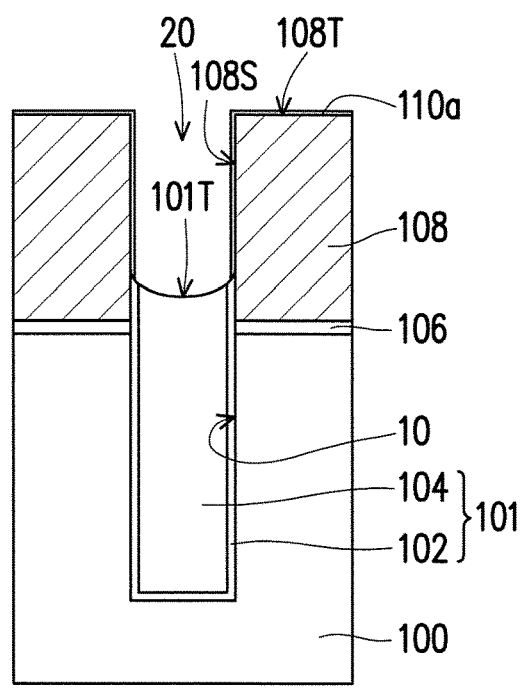

Thereafter, a heat treatment 112 is performed on the second dielectric layer 110 to enhance bonding between the second dielectric layer 110 and the first conductive layer 108. Specifically, the heat treatment 112 may enhance the Si—N bonding between the silicon (Si) in the first conductive layer 108 and the nitrogen (N) in the second dielectric layer 110. In alternative embodiments, after the heat treatment 112 is performed, silicon oxynitride may be formed between the first conductive layer 108 and the second dielectric layer 110. The silicon oxynitride is removed during a subsequent wet etching process (as shown in FIG. 1C). On the other hand, the second dielectric layer 110 on the top surface 101T covering the isolation structure 101 is not enhanced.

In one embodiment, the heat treatment 112 may be a rapid thermal annealing process. In one embodiment, the temperature of the rapid thermal annealing process is 850° C. to 1050° C.; the time of performing the rapid thermal annealing process is from 1 second to 60 seconds; and the gas introduced in the process is nitrogen. In alternative embodiments, the temperature of the rapid thermal annealing process is 950° C. to 1000° C.; the time of performing the rapid thermal annealing process is from 1 second to 10 seconds or 1 second to 5 seconds; and the gas introduced in the process is nitrogen. When the time of performing the rapid thermal annealing process is longer than 10 seconds, additional thermal budget is generated, which can easily cause the device to be unstable and result in a waste of production capacity. Specifically, the heat treatment 112 is performed after an ion implantation process of all wells of the whole device is conducted. Therefore, when the wells undergo the heat treatment 112 for longer than 10 seconds, the additional thermal budget is generated such that the dopant in the wells is diffused, causing the device to be unstable. On the other hand, when the rapid thermal annealing process is performed for less than 1 second, the strength of the Si—N bonding between the first conductive layer 108 and the second dielectric layer 110 is insufficient such that the subsequent etching process damages the surface of the first conductive layer 108, which causes the reliability and yield of the device to be reduced.

Referring to FIGS. 1B and 1C, after the heat treatment 112 is performed, the etching process is carried out to remove a portion of the second dielectric layer 110 so as to expose the top surface 101T of the isolation structure 101. In one embodiment, the etching process may be a wet etching process, which may use a diluted hydrogen fluoride (DHF) solution as an etching liquid. Since the heat treatment 112 already enhances the Si—N bonding between the first conductive layer 108 and the second dielectric layer 110, after the etching process is performed, there is still remaining second dielectric layer 110a covering the top surface 108T and the sidewall 108S of the first conductive layer 108. In one embodiment, the thickness of the remaining portion of the second dielectric layer 110a covering the first conductive layer 108 is less than or equal to 20A.

It should be indicated that the remaining second dielectric layer 110a can protect the top surface 108T and the sidewall 108S of the first conductive layer 108 from being etched so that the top surface 108T and the sidewall 108S of the first conductive layer 108 maintain to be smooth. The first conductive layer 108 having the smooth surface can help to reduce generation of the void or the seam in the second conductive layer 116 (as shown in FIG. 1E) that is formed subsequently, thereby improving the reliability and yield of the device. In addition, after the etching process is performed, the second dielectric layer (as shown in FIG. 1C) on the top surface 101T of the isolation structure 101 can be completely removed to avoid the issue of electrical disturbance between the first conductive layers 108 on both sides of the isolation structure 101 during operation of the memory device.

Figure 1D:
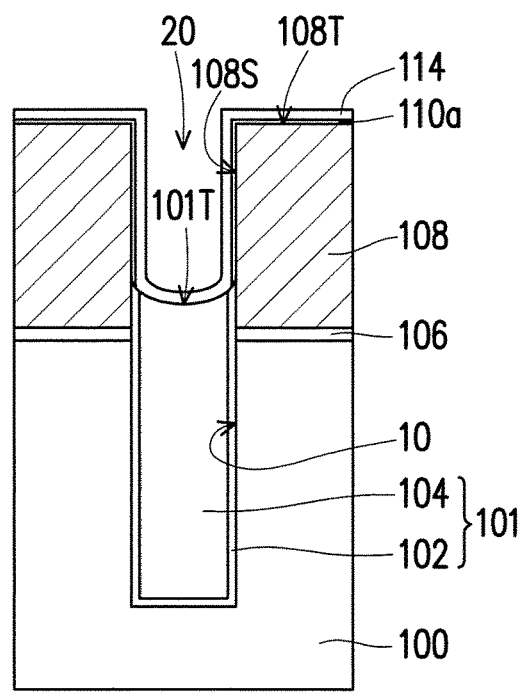
Figure 1E:
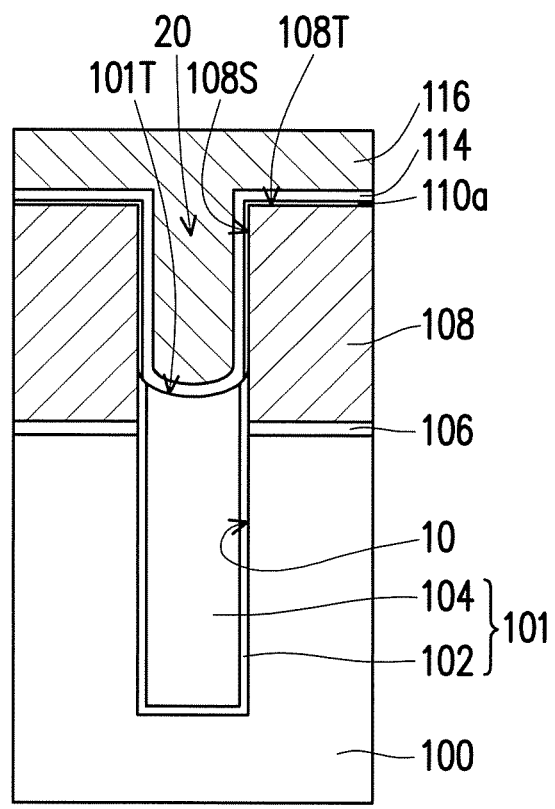

Referring to FIGS. 1C and 1D, a third dielectric layer 114 is formed on the substrate 100. The third dielectric layer 114 conformally covers the remaining portion of the second dielectric layer 110a and the top surface 101T of the isolation structure 101. In one embodiment, the third dielectric layer 114 is directly in contact with the top surface 101T of the isolation structure 101. In one embodiment, the third dielectric layer 114 may be a multiple layer structure consisting of silicon oxide/silicon nitride/silicon oxide/silicon nitride, which should not be constructed as a limitation to the invention. In other embodiments, the third dielectric layer 114 may be a multiple layer structure consisting of a random number of layers of silicon oxide and silicon nitride. In alternative embodiments, the third dielectric layer 114 may be a multiple layer structure consisting of a high dielectric constant material. The high dielectric constant material may be a dielectric material having a dielectric constant greater than 4. In one embodiment, the thickness of the third dielectric layer 114 may be from 9 nm to 14 nm, and the forming method includes a thermal oxidation process, a chemical vapor deposition process, a plasma nitridation process or a combination thereof. The dielectric structure consisting of the second dielectric layer 110a and the third dielectric layer 114 may be used as an inter-gate dielectric layer between the first conductive layer 108 (e.g. floating gate) and the second conductive layer 116 (e.g. control gate) formed subsequently so as to electrically isolate the first conductive layer 108 from the second conductive layer 116 (as shown in FIG. 1E).

Referring to FIG. 1D and FIG. 1E, after the third dielectric layer 114 is formed, the second conductive layer 116 may be formed on the substrate 100. The second conductive layer 116 is filled in the second opening 20 and covers the top surface 108T of the first conductive layer 108. In the embodiment, the second conductive layer 116 may be a control gate. The material of the second conductive layer 116 comprises polysilicon. In one embodiment, the thickness of the second conductive layer 116 may be about 35 nm, and the forming method thereof may be the chemical vapor deposition process.

In summary of the above, the invention may enhance the Si—N bonding between the second dielectric layer and the first conductive layer (e.g. floating gate) via the rapid thermal annealing process. After the etching process is performed, there is still remaining second dielectric layer disposed on the sidewall of the floating gate to protect the floating gate from being damaged. Therefore, the floating gate may have a smooth surface to reduce generation of the void or the seam in the second conductive layer (e.g. control gate), thereby improving the reliability and yield of the device.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A method of manufacturing a memory device, comprising:
    forming a first dielectric layer and a first conductive layer in order on a substrate;
    forming a first opening and a second opening on the first opening in the substrate, the first dielectric layer and the first conductive layer;
    forming an isolation structure in the first opening, wherein a top surface of the isolation structure is lower than a top surface of the first conductive layer;
    forming a second dielectric layer on the substrate so that the second dielectric layer conformally covers the top surface of the first conductive layer and a surface of the second opening;
    performing a heat treatment on the second dielectric layer to enhance a bonding between the second dielectric layer and the first conductive layer, wherein a gas introduced in the heat treatment is nitrogen;
    performing an etching process to remove a portion of the second dielectric layer so as to expose the top surface of the isolation structure; and
    forming a third dielectric layer on the substrate so that the third dielectric layer covers a remaining portion of the second dielectric layer and the top surface of the isolation structure.

2. The method of manufacturing the memory device according to claim 1, wherein the heat treatment comprises a rapid thermal annealing process.

3. The method of manufacturing the memory device according to claim 2, wherein a temperature of the rapid thermal annealing process is 850° C. to 1050° C., and a time of performing the rapid thermal annealing process is from 1 second to 60 seconds.

4. The method of manufacturing the memory device according to claim 2, wherein a temperature of the rapid thermal annealing process is 950° C. to 1000° C., and a time of performing the rapid thermal annealing process is from 1 second to 10 seconds.

5. The method of manufacturing the memory device according to claim 1, wherein the first dielectric layer is a tunneling dielectric layer, a material thereof comprises silicon oxide, and the third dielectric layer comprises a multiple layer structure consisting of silicon oxide/silicon nitride/silicon oxide/silicon nitride.

6. The method of manufacturing the memory device according to claim 1, wherein a material of the second dielectric layer comprises silicon nitride, silicon oxynitride or a combination thereof.

7. The method of manufacturing the memory device according to claim 1, wherein the first conductive layer is a floating gate, and a material thereof comprises polysilicon.

8. The method of manufacturing the memory device according to claim 1, wherein after the portion of the second dielectric layer is removed, a thickness of a remaining portion of the second dielectric layer covering the first conductive layer is less than or equal to 20 Å.

9. The method of manufacturing the memory device according to claim 1, after the third dielectric layer is formed, further comprising forming a second conductive layer on the substrate so that the second conductive layer is filled in the second opening.

10. The method of manufacturing the memory device according to claim 9, wherein the first conductive layer is a floating gate, the second conductive layer is a control gate, and the second dielectric layer and the third dielectric layer between the first conductive layer and the second conductive layer is an inter-gate dielectric layer.

* * * * *